United States Patent
Peterson (10) Patent No.: US 6,348,814 B1
(45) Date of Patent: Feb. 19, 2002

(54) CONSTANT EDGE OUTPUT BUFFER CIRCUIT AND METHOD

(75) Inventor: LuVerne Peterson, San Diego, CA (US)

(73) Assignee: Cadenca Design Systems, Inc., San Jose, CA (US)

( * ) Notice: Subject to any disclaimer, the term of this patent is extended or adjusted under 35 U.S.C. 154(b) by 0 days.

(21) Appl. No.: 08/799,953

(22) Filed: Feb. 14, 2000

(51) Int. Cl.[7] .............................................. H03K 19/02
(52) U.S. Cl. ........................................ 326/58; 326/27
(58) Field of Search .............................. 326/56, 57, 58, 326/83, 26, 27

(56) References Cited

U.S. PATENT DOCUMENTS 5,066,872 A * 11/1991 Schenck ...................... 326/58
5,081,374 A * 1/1992 Davis ........................... 326/57

FOREIGN PATENT DOCUMENTS

JP    363294123   * 11/1988   .................. 326/58
JP    403227113   * 10/1991   .................. 326/58

* cited by examiner

*Primary Examiner*—Michael J. Tokar
*Assistant Examiner*—Daniel D. Chang
(74) *Attorney, Agent, or Firm*—John Schipper (57) ABSTRACT

A buffer circuit and method provide substantially constant output signal edges to facilitate service as a bus driver with enhanced timing flexibility. The buffer circuit includes a NOR gate and a NAND gate for driving output pulldown and pullup transistors. The initiation of current flows through the NOR and NAND gates is controlled by an environmentally adaptive reference circuit. First and second transistors are provided respectively between the NAND gate and the pullup transistor, and between the NOR gate and the pulldown transistor, to produce enhanced sourcing and sinking currents. The enhanced sinking and sourcing currents are timely terminated by switching of the pulldown and pullup transistors to save energy.

12 Claims, 8 Drawing Sheets

CONSTANT EDGE OUTPUT BUFFER CIRCUIT AND METHOD

FIELD OF THE INVENTION

The field of the present invention relates to buffer circuits and methods, and particularly to buffer circuits providing substantially constant output signal edges.

BACKGROUND OF THE INVENTION

Output buffer circuits with highly controlled output edge rates are well known. Such circuits are however typically produced subject to substantial process variations which cause concomitant undesired performance variations. Some such buffer circuits manufactured will thus be fabricated to have fast processes which cause long signal ringing until stabilization occurs. Other such buffers are fabricated to have slow processes which take inordinately long to reach a desired signal level. Particular buffer circuits with fast processes operating at low temperatures and at high VDD voltages are known to produce a high edge rate which is suitable for strong output driver applications. However, such fast processes produce undesirable voltage reflections from bus line loads, such as receiver integrated circuits (ICs). Bus timing must then be adjusted to enable damping of reflections to a voltage level permitting effective operation. With slow processes operating at a high temperature and at a low VDD voltage, a slow edge rate is produced having a diminished drive capacity of the bus, which possibly causes the far end of the signal bus not to switch in time. Bus timing must thus be adjusted to allow for a weak output driver. Data transfer, particularly on large, heavily loaded buses, is thus limited by the range of edge rates at the output of CMOS buffers for both fast and slow processes. In general, CMOS output buffer circuits do have an advantage in that they dissipate substantially no static, i.e., direct current(DC) power, unless terminating resistors are added to the buses.

Various design approaches have been developed to reduce the edge rate range of CMOS output buffers. For example, a pair of predrive transistors with gates that drive output pullup and pulldown transistors have been constructed which are longer than the minimum length required to limit process variation in the predriver edge rate. According to another example, predriver transistors have been activated with complex predriver gates, e.g., as with another known output buffer circuit which reduces variability of the edge rate as a function of the number of control signals used and the complexity of the control circuitry itself. A substantial area of silicon is however consumed by such complex predriver gate circuitry. According to another approach, extra loading is applied at the outputs of the predriver transistors to adjust the predriver edge rate. This correspondingly adjusts the edge rate of the output transistors. This approach however relies upon use of multiple control signals for fine edge rate selection. The loads for such predriver circuitry however also consume a considerable silicon area.

It is accordingly desirable to develop simple buffer circuits which consume only limited space on an integrated circuit semiconductor substrate and which produce output signals of enhanced timing flexibility based on edge rate control.

SUMMARY OF THE INVENTION

A buffer circuit according to the present invention provides substantially constant output signal edges, thereby serving as an enhanced bus driver with enhanced output stability independent of process and operating conditions. The buffer circuit includes a NOR gate and a NAND gate for driving output pulldown and pullup transistors with enhanced current devices connected to the gates of the pullup and pulldown transistors. The initiation and maintenance of current flows through the NOR and NAND gates of the buffer circuit according to the present invention is controlled by a reference circuit. First and second transistors are provided respectively between the NAND gate and the pullup transistor, and between the NOR gate and the pulldown transistor to produce enhanced sourcing and sinking currents. According to the method of the present invention, sinking and sourcing currents to the pulldown and pullup are terminated by switching of the pulldown and pullup transistors and feedback to the transistors producing the enhanced sourcing and sinking currents. Analog, self-setting circuitry, according to the present invention, sets the control lines from first and second analog voltage reference generators having a direct current (DC) input to control the buffer circuit output edge rate and for a limited time, to control the turn-on voltage of the output pullup and pulldown transistors. The output edge rate variation from the buffer circuit according to the present invention is accordingly substantially reduced. Changes in voltage and temperature are further automatically compensated by the analog reference circuit controlling the buffer circuit, according to the present invention.

DETAILED DESCRIPTION OF A PREFERRED EMBODIMENT

Figure 1:
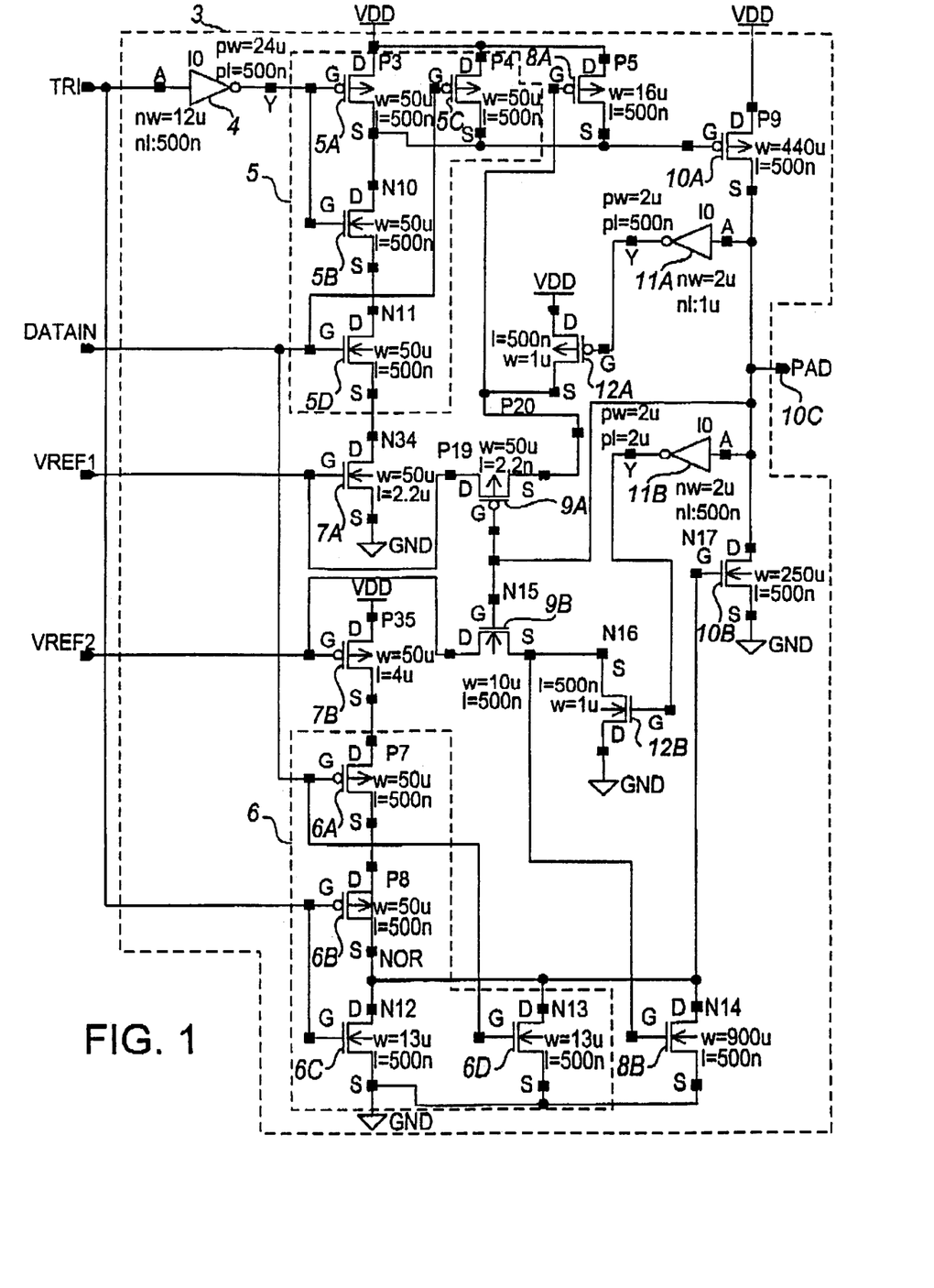
FIG. 1 is a diagram of a circuit of an output buffer circuit according to the present invention.

FIG. 1 is a diagram of an output buffer circuit 3 according to the present invention. Buffer circuit 3 is a tristateable output buffer circuit having predriver circuitry including an inverter 4, a NAND gate 5, a NOR gate 6, wide and long transistors 7A and 7B, transistors 8A and 8B, transistors 9A and 9B, respective pullup and pulldown transistors 10A and 10B, invertors 11A and 11B, transistors 12A and 12B. Wide and long transistors herein have a gate which is substantially longer and at least as wide as the gates of the other transistors serially connected thereto between VDD and ground. NOR gate 6 drives an output pulldown transistor 10B. NAND gate 5 drives an output pullup transistor 10A. NOR gate 6 receives inputs TRI and DATAIN, and includes transistors P7, P8, N12 and N13 (respectively designated as transistors 6A, 6B, 6C, and 6D). NAND gate 5 receives input signals DATAIN and inverted signal TRI through inverter 4. Asserting TRI ensures that the output at pad 10C will not go high or low. NAND gate 5 includes transistors P3, P4, N10, and N11 (respectively designated as transistors 5A, 5C, 5B, and 5D. Transistors 5A, 5B, 5D, and 7A are respectively connected in series, between VDD and ground. Similarly, transistors 7B, 6A, 6B, and 6C are respectively connected in series, between VDD and ground. Further, pullup transistor 10A and pulldown transistor 10B are connected at their respective sources to an output pad 10C (i.e., PAD). The gate of pullup transistor 10A is connected to the sources of transistors 5A, 5C, and 8A. Similarly, the gate of pulldown transistor 10B is connected to the drains of transistors 6C, 6D, and 8B. Output pad 10C is further connected to invertors 11A and 11B, and to the gates of transistors 9A and 9B. The respective drains of transistors 9A and 9B are connected to the respective gates of transistors 7A and 7B which in turn are connected to input reference voltages VREF1 and VREF2. Inverters 11A and 11B are respectively connected to the gates of transistors 12A and 12B. The respective sources of transistors 9A and 9B are connected to the respective drains of transistors 12A and 12B, and to the respective gates of transistors 8A. Analog voltages VREF1 and VREF2 are provided by the circuitry of FIG. 2 as seen below to control the edge rates of output pullup transistor 10A and output pulldown transistor 10B, respectively. When DATAIN goes high and TRI is low, where DATAIN was previously low, then the PAD voltage starts low. Thus, transistor 9A (i.e., device P19) is on, and transistor 12a (i.e., device P20) is off. Thus, the voltage on VREF1 is fed to the gate of transistor 8A (i.e., device P5) as well as to the gate of transistor 7A (i.e., device N34). This voltage will be in a predetermined range of VDD, e.g., approximately 3.3 Volt for the slowest conditions to approximately 1.8 volts for the fastest conditions, depending in analog fashion on process, VDD voltage, and temperature. If process conditions are slow but not extremely slow, VREF1 is lower than VDD, reducing the Vgs voltage of transistor 7A (i.e., device N34) but not turning on transistor 8A (i.e., device P5). Accordingly, NAND gate 5 switches more slowly, reducing the edge rate of signals provided from output pullup transistor 10A. Thus, the edge rate at output pad 10C stays about the same as in worst case conditions. Under typical conditions, the VREF1 voltage will be low enough so that transistor 8A will start to turn on, providing a small current from VDD, as well as causing transistor 7A to have a lower Vgs voltage. This reduces the edge rate of NAND gate 5 further, keeping the edge rate at pad 10C about the same as before. Under fast process conditions, transistor 8A is turned on harder, providing transistor 7A with an even lower Vgs voltage. In this case, the output of NAND 5 will switch slowly and only to an intermediate low voltage, turning on output pullup transistor 10A only partially. Pad node 10C will accordingly again switch at about the same edge rate. As the pad voltage nears VDD, transistor 9A turns off. Accordingly, transistor 9B turns on and transistor 12B turns off. Additionally, transistor 12A turns on, taking the gate of transistor 8A high and turning it off, thus allowing the output of gate NAND 5 to go low and preventing the buffer circuit 3 according to the present invention from dissipating DC current unnecessarily. NOR gate 6 is connected to VREF2 and works similarly to NAND gate 5 circuitry described above, except that corresponding voltages and transistor types are reversed. Inverters I1 and I2, i.e., devices 11A and 11B, have corresponding n and p transistors that are ratioed to switch when the pad voltages go high and low respectively.

Figure 2:
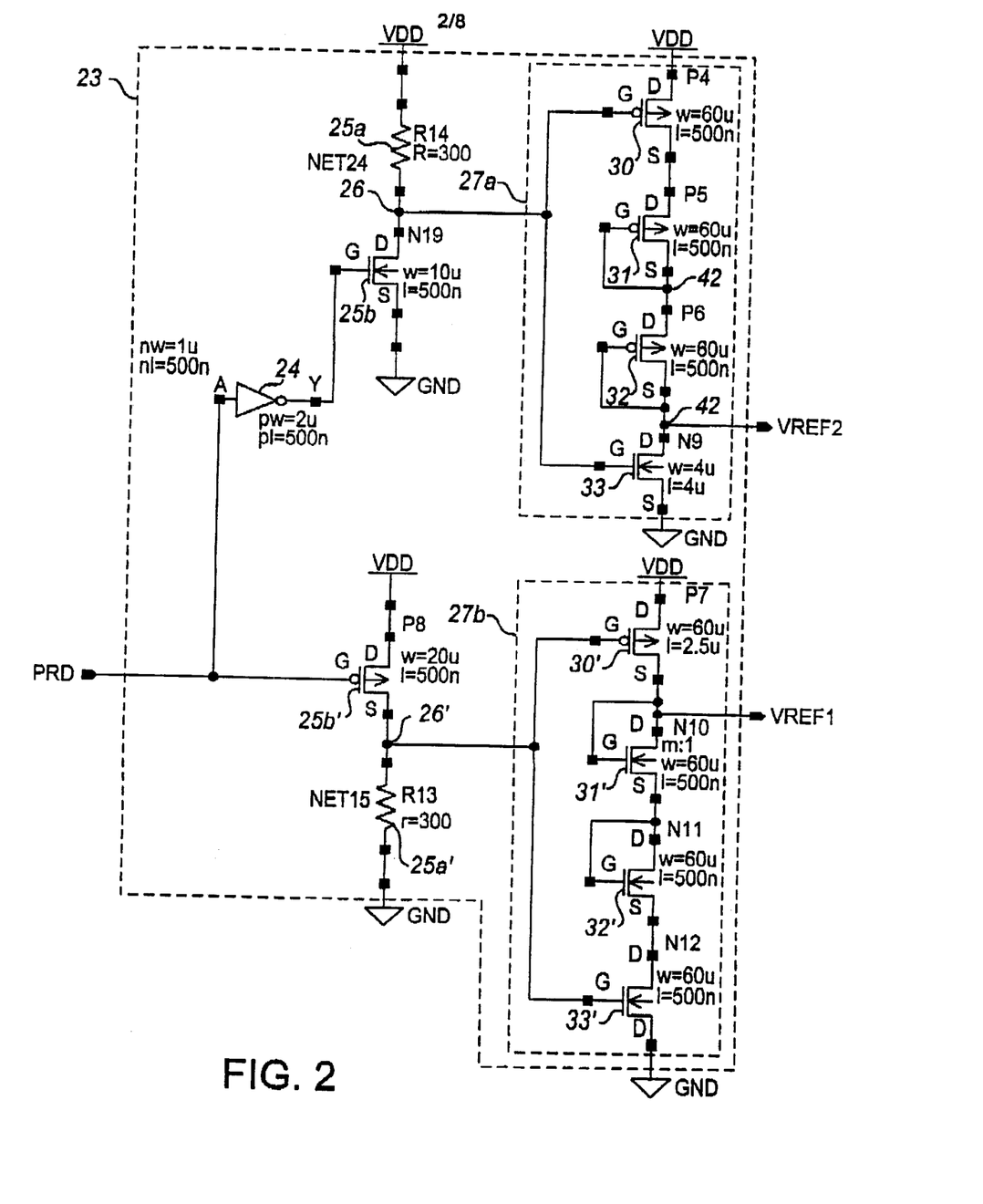
FIG. 2 is a diagram of a reference circuit for the output buffer circuit according to the present invention.

FIG. 2 is a diagram of a reference circuit 23 according to the present invention, which is used to generate respective voltages VREF1 and VREF2 for output buffer circuit 3 shown in FIG. 1. Reference circuit 23 includes an inverter 24, resistors 25a and 25'a, transistors 25b and 25'b, and drive transistor sets 27a and 27b. A power down signal (PRD) is provided to inverter 24 and transistor 25'b. Transistor set 27a includes, in sequential series between VDD and ground, transistors 30, 31, 32, and 33. Transistor set 27b includes, in sequential series between VDD and ground, transistors 30', 31', 32', and 33'. Transistors 31, 32, 31', and 32' are gate connected as diodes. Resistors 25a and 25'a are poly or diffusion type resistors and are connected in series with respective transistors 25b and 25'b, i.e., transistor devices N19 and P8, to generate bias voltages which drive respective transistor sets 27a and 27b'. Current through resistors 25a and 25'a is controlled by input power down signal PRD. When this power down signal is high, DC current flow during testing is prevented, while still permitting output switching. However, output edges will not be regulated. Diode-connected p transistors 31 and 32 i.e., respective transistor devices P5 and P6, prevent VREF2 voltage from going so high that predriver NOR gate 6 in FIG. 1 will not switch. Respective transistors 31' and 32', i.e., transistor devices N10 and N11, similarly prevent VREF1 voltage from going so low as to prevent NAND predriver gate 5 in FIG. 1 from switching (i.e., below 1.8 volts). Resistors 25a and 25'a are chosen to have substantially the same resistance and geometry, to ensure they will track each other over a predetermined process range resistance. For silicided poly, the variation in resistance is about +/−15%. The simulation results which follow below in Tables 1–3 show edge rate and delay variation for selected nominal and extreme conditions with a nominal resistance of 300 ohms, a high resistance 345 ohms, and a low resistance of 255 ohms. The edge rates range from about 1.6 nsec to about 2.6 nsec with 1.85 nsec and 1.88 nsec being typical edge rates, except for the values of FF with a high resistance edge rate for rise. In that case, the reference voltages are beyond desired values. With increased transistor sizing or a lower starting resistance for the resistors, these numbers can be reduced, in accordance with the present invention. Taking the range of edge rates indicated above, the edge rate shortens by only to about −15% and lengthens by about 40% from the nominal values.

Figure 3A:
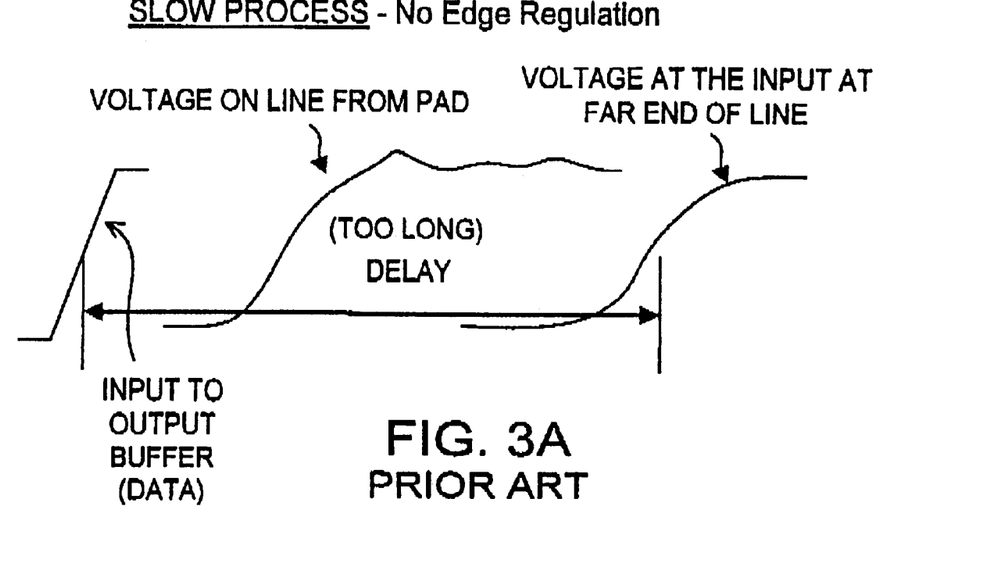
FIGS. 3A–3C are respective signal diagrams of input and output signals for selected output buffer circuits, showing line voltages from a selected pad, without edge regulation for fast and slow processes, and with controlled edge regulation.
Figure 3B:
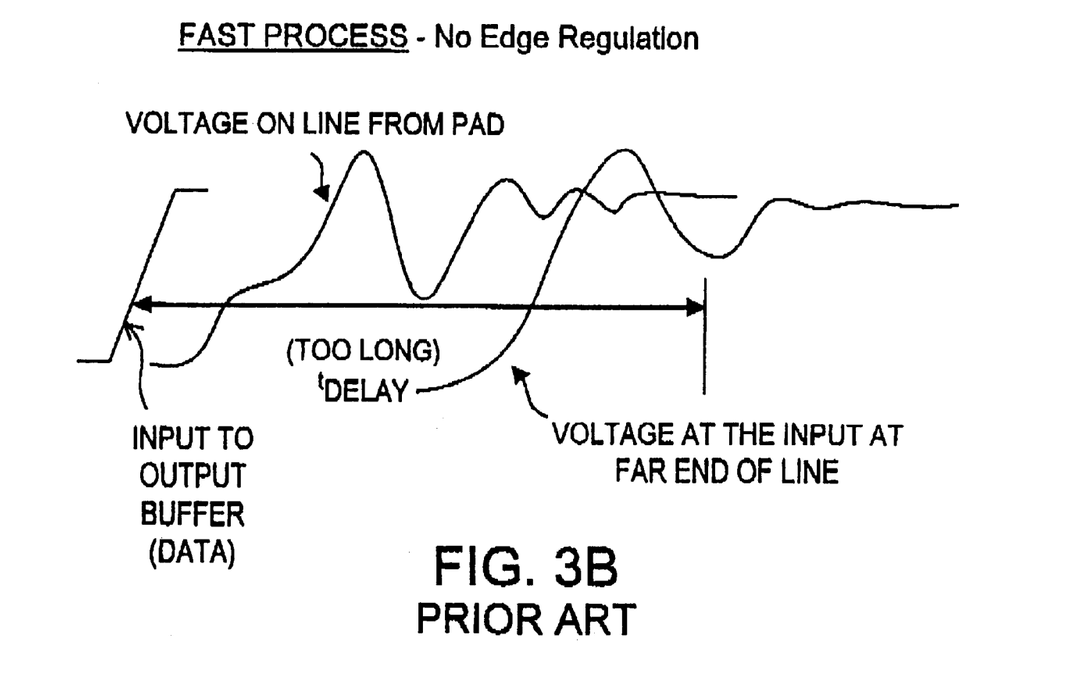
Figure 3C:
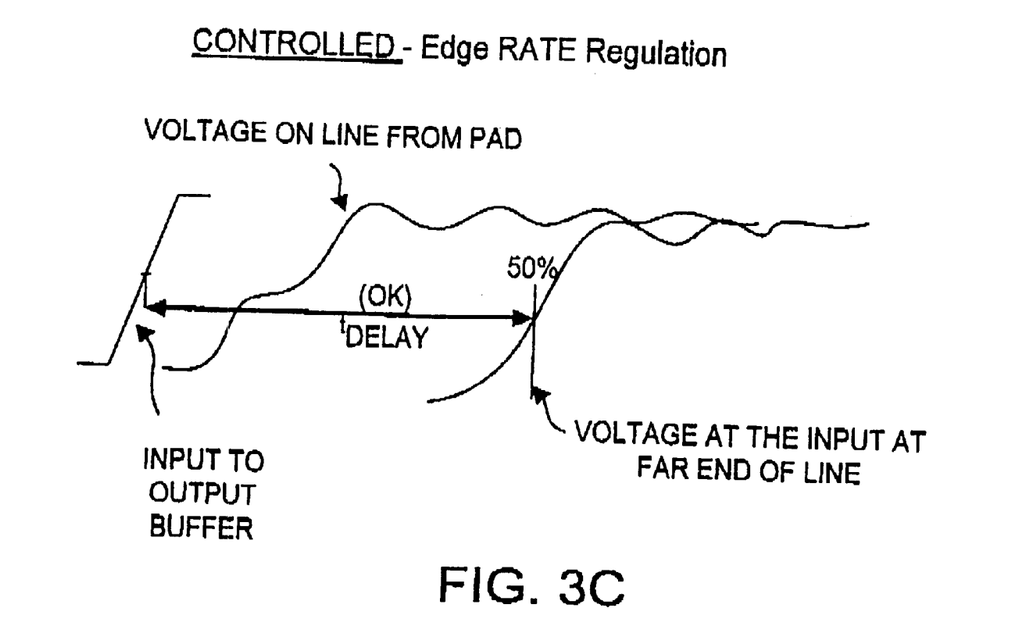

FIGS. 3A–3C are respective signal diagrams for a common data input signal to an output buffer, showing resultant voltages at a line from a pad and at the far end of the line, respectively without edge regulation for a slow process, without regulation for a fast process, and with controlled edge regulation. The need for a controlled edge rate output buffer is demonstrated in FIGS. 3A–3C. The desired edge rate and output drive strength is shown in FIG. 3C. A desired edge rate buffer has a short delay through the buffer and sufficient drive strength to switch the line on the board without causing large reflective voltage swings. FIG. 3A shows voltage waveforms for the case in which the semiconductor fabrication process yields slow transistors for the output buffer. With such slow transistors, it takes more time for input signals to get through the buffer circuitry. Further, the buffer will have insufficient drive to discharge or charge the line in the desired time. FIG. 3B shows a case in which the semiconductor fabrication process yields fast transistors for use in the buffer circuitry. The delay through the buffer with such fast transistors is short, but the drive strength resulting is so high that large oscillations in current and voltage occur on the bus being driven. The desired high voltage level, i.e., a stable voltage on the entire line that is sufficiently above the switch voltage of the input buffers, does not occur for one or two voltage oscillations on the line. The time lost allowing the line to settle to such desired high level may accordingly be longer than desired. Thus, it is desirable to have an output buffer with as little process dependence as possible, to accordingly create the highest data transfer rate possible.

Figure 4:
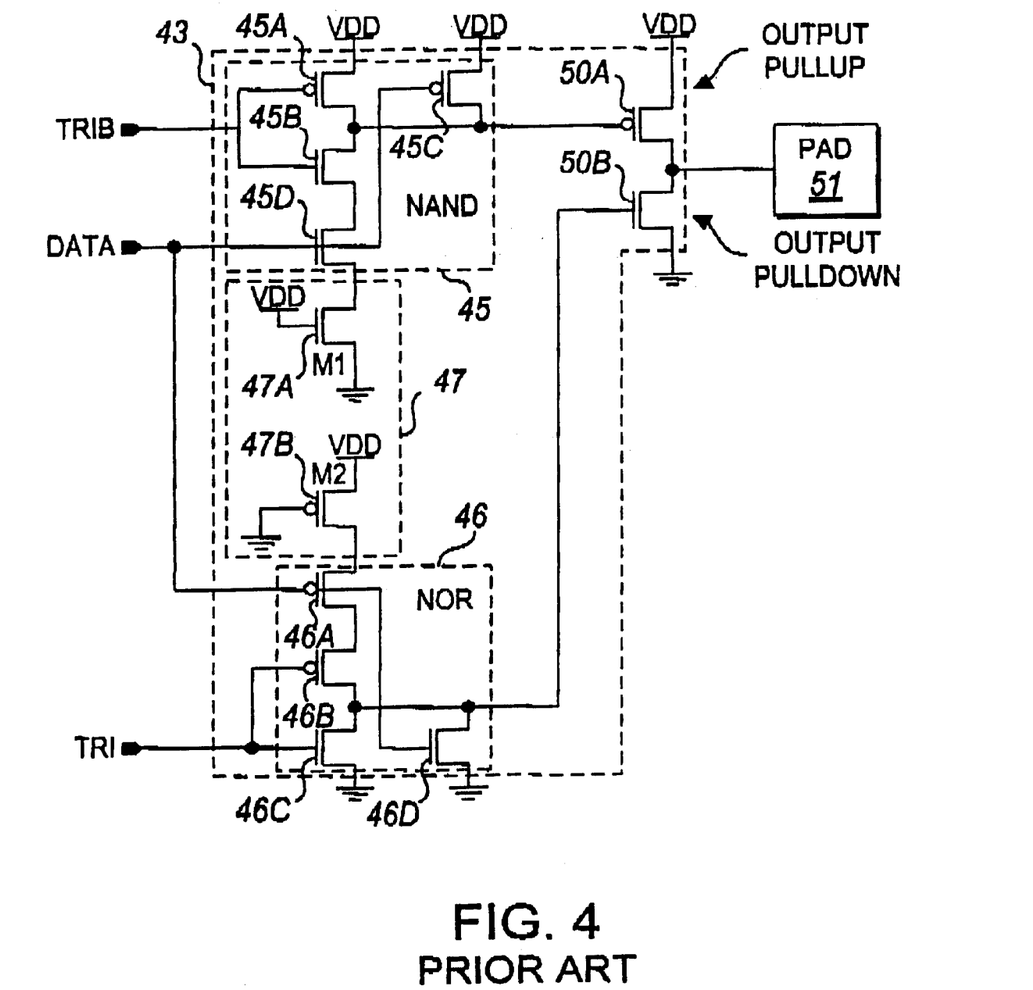
FIG. 4 is a diagram of a prior art circuit for providing edge control for output buffer circuits, using long, wide transistors which are substantially process independent.

FIG. 4 is a diagram of a prior art buffer 43 for providing edge control using long, wide transistors 47 which are of reduced process dependence. Output buffer circuit 43 includes a NAND gate 45, a NOR gate 46, wide and long transistors 47, and pullup and pulldown transistors 50A and 50B. NAND gate 45 includes transistors 45A–45D. Transistors 45A, 45B and 45D are connected to each other in series. The gates of transistors 45A and 45B, and the gates of transistors 45C and 45D are connected to each other. Wide and long transistors 47 include transistors 47A and 47B. NOR gate 46 includes transistors 46A–46D. Transistors 46A and 46B are connected to each other in series. The gates of transistors 46A and 46D and the gates of transistors 46B and 46C are connected to each other. Input TRIB is applied to NAND gate 45 and gates 45A and 45B. Input data is applied to NAND gate 45 at transistors 45C and 45D, and to NOR gate 46 at transistors 46A and 46D. VDD is applied to wide and long transistor 47A, and ground potential is applied to wide and long transistor 47B. Input TRI is applied to NOR gate 46 at the gates of transistors 46A and 46B. Process dependence on edge rate and drive strength is sought to be reduced in buffer circuit 43 of FIG. 4. The output buffer schematic shows a tristatable output buffer with long and wide transistors 47 respectively M1 and M2. Transistors 47 are longer than the minimum length, to reduce dependence on transistor poly etch, but not the dependence on oxide thickness. Transistors 47 do not modify the higher or lower drive strength of output transistors 50A and 50B. Transistors 47 only reduce variation in rate with which output pullup and pulldown transistors 50A and 50B are turned on.

Figure 5:
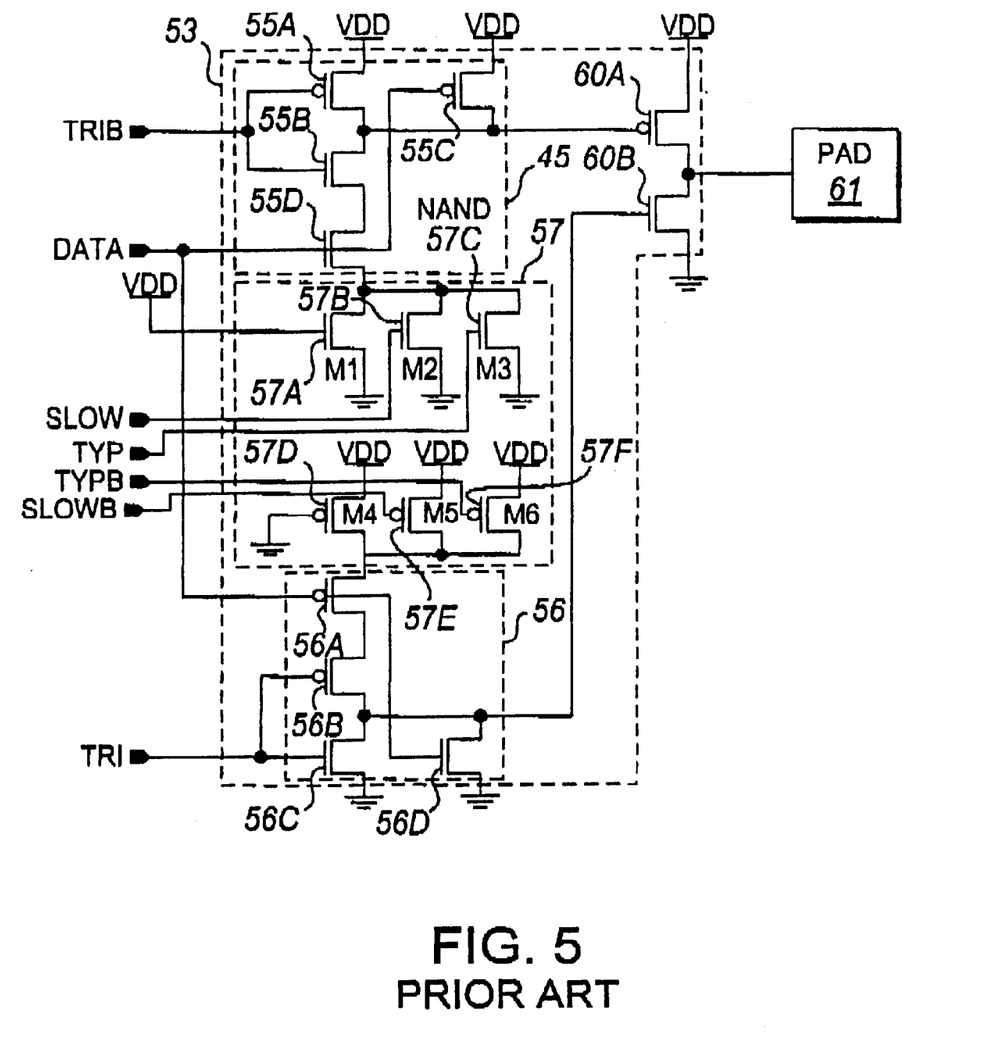
FIG. 5 is a diagram of a prior art circuit for providing edge control for output buffer circuits, using short, narrow transistors.

FIG. 5 is a diagram of a prior art buffer circuit 53 for providing edge control using short, narrow transistors 57 either activated by slow signals or left off. Short, narrow transistors are transistors having gates which are minimum length and substantially narrower than other transistors in a buffer circuit. Output buffer circuit 53 includes a NAND gate 55, a NOR gate 56, short and narrow transistors 57, and pullup and pulldown transistors 60A and 60B. NAND gate 55 includes transistors 55A–55D. Transistors 55A, 55B, and 55D are connected to each other in series. The gates of transistors 55A and 55B and the gates of transistors 55C and SSD are connected to each other. Short and narrow transistors 57 include transistor 57A–57F. NOR gate 56 includes transistors 56A–56D. Transistors 56A and 56B are connected to each other in series. The gates of transistors 56A and 56D and the gates of transistors 56B and 56C are connected to each other. Input signal TRIB is applied to NAND gate 55 and its gates 55A and 55B. Input DATA is applied to NAND gate 65 at transistors 65C and 65D, and to NOR gate 66 at transistors 66A and 66D. VDD is applied to short and narrow transistor 57A; signals slowb and typb are respectively applied to the gates of transistors 57B and 57C; ground is applied to short and narrow transistor 57D; signals slowb and typb are respectively applied to the gates of transistors 57E and 57F. Input TRI is applied to NOR gate 56 at the gates of transistors 56A and 56B. Process dependence is sought to be reduced with prior art buffer circuit 53 in FIG. 5. Buffer circuit 53 relies on an external circuit (not shown) to generate control signals labeled SLOW, SLOWB, TYP, and TYPB, at the time when buffer circuit 53 is powered up. TYP and TYPB control signals are typical fast signals. Signal levels are set according to Chart A as follows:

CHART A
DIGITAL SIGNAL LEVELS

| SLOW | SLOWB | TYP | TYPB | PROCESS |
|------|-------|-----|------|---------|
| 0 | 1 | 0 | 1 | FAST |
| 0 | 1 | 1 | 0 | TYPICAL |
| 1 | 0 | 1 | 0 | SLOW |

Substantially short, narrow transistors 57 are used with the gates of respective pulldown n-type transistors 57A–57C connected respectively to power, slow, and typical. The dimensions short and narrow are defined as transistor gate widths ons on a particular semiconductor chip, which are substantially (e.g., more than 10% wider and narrower than most other transistors on the chip. Further, the gates of the p transistors 57D–57F are connected to respective signals ground, SLOWB and TYPB. The widths of transistors 57D–57F are used to overcompensate for the output pullup and pulldown. For example, if a fast process is set for a particular semiconductor chip, pullup and pulldown transistors 60A and 60B respectively are more slowly switched than typical by the small transistors tied high and low (M1–M3 and M4–M6, respectively). A shortcoming of this prior art buffer circuit 53 is that whatever conditions exist at powerup will determine the levels of the control signals. Accordingly, changes in environment (voltage or temperature) are not tracked, and the edge rate and drive strength can vary substantially for prior art buffer circuit 53.

Figure 6:
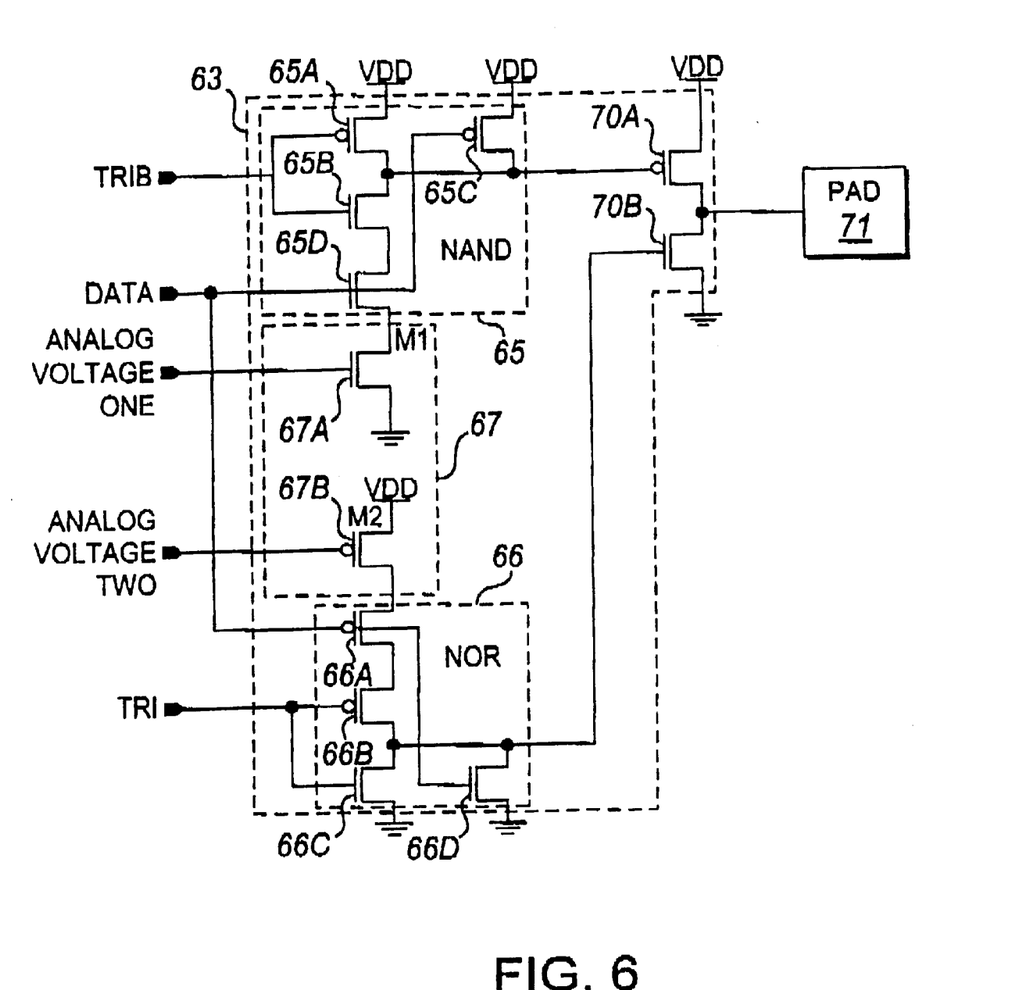
FIG. 6 is a diagram of an output buffer circuit according to one embodiment of the present invention.

FIG. 6 is a diagram of an output buffer circuit 63 according to one embodiment of the present invention. Output buffer circuit 63 includes a NAND gate 65, a NOR gate 66, wide and long transistors 67, and pullup and pulldown transistors 70A and 70B. Wide and long transistors herein have a gate which is substantially longer and wider than that of other transistors in the buffer circuit. Wide and long transistors 67 include transistor 67A and 67B. NAND gate 65 includes transistors 65A–65D. Transistors 65A, 65B, 65D and 67A are connected to each other in series between VDD and ground. The gates of transistors 65A and 65B and the gates of transistors 65C and 65D are connected to each other. NOR gate 66 includes transistors 66A–66D. Transistors 67B, 66A and 66B are connected to each other in series between VDD and ground. The gates of transistors 66A and 66D and the gates of transistors 66B and 66C are connected to each other. Input TRIB is applied to NAND gate 65 and to the gates of transistors 65A and 65B. Input DATA is applied to NAND gate 65 at transistors 65C and 65D, and to NOR gate 66 at transistors 66A and 66D. ANALOG VOLTAGE ONE is applied to wide and long transistor 67A, and ANALOG VOLTAGE TWO is applied to wide and long transistor 67B. Input TRI is applied to NOR gate 66 at the gates of transistors 66A and 66B. Input TR1 is the logical complement of input TR1B. According to the present invention, analog input voltages including ANALOG VOLTAGE ONE and ANALOG VOLTAGE TWO are used to control the rate at which large, long transistors 67 turn on. ANALOG VOLTAGE ONE increases to near VDD for slow process and to nearly the threshold voltage of transistor 67A, i.e., M1, for fast processes, as indicated in Chart B below. The indicated analog inputs vary with changes in conditions, according to the present invention.

CHART B

| ANALOG VOLTAGE ONE | ANALOG VOLTAGE TWO | PROCESS |
|---|---|---|
| near $2V_{TN}$ | near $2V_{TN}$ | FAST |
| ~2VDD/3 | ~ VDD/3 | TYPICAL |
| ~VDD | ~ 0V | SLOW |

Figure 7:
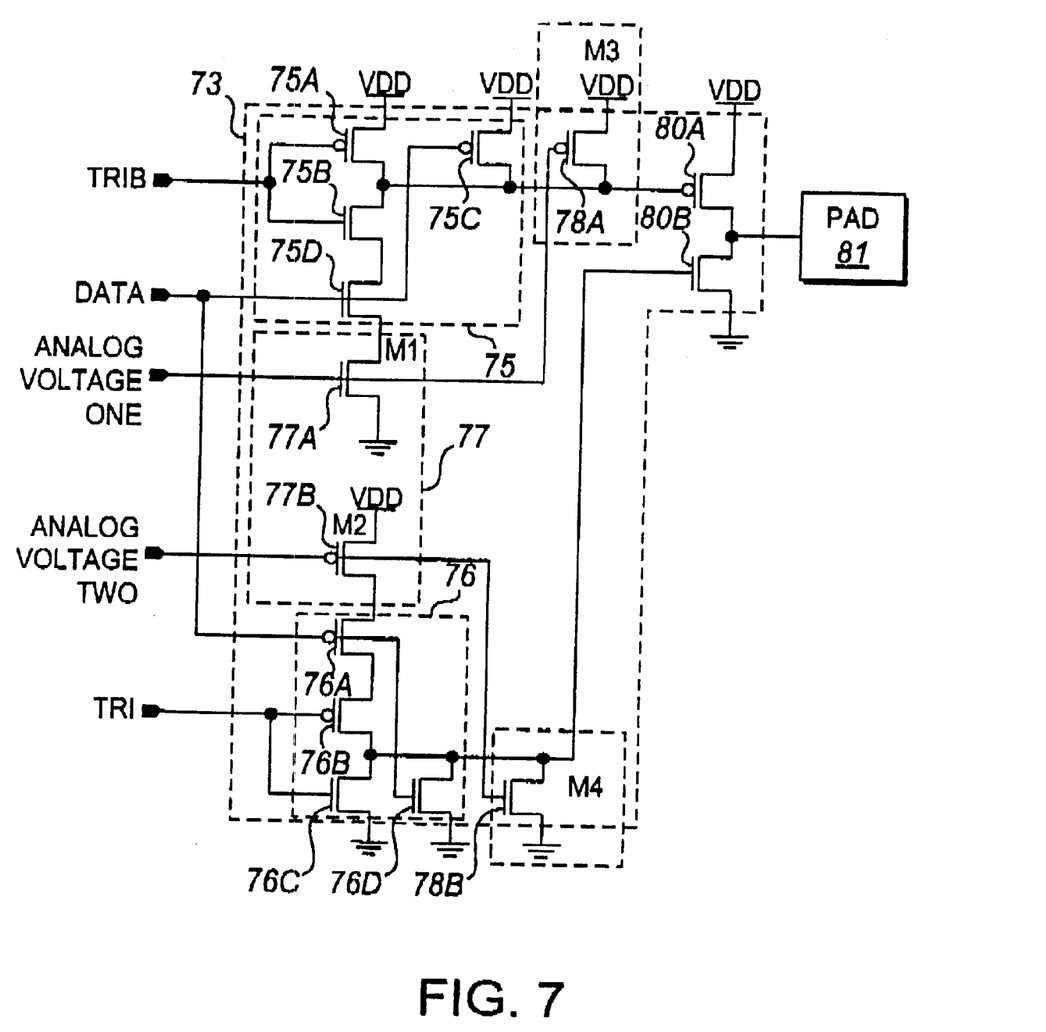
FIG. 7 is a diagram of an output buffer circuit according to another embodiment of the present invention.

FIG. 7 is a diagram of an output buffer circuit according to another embodiment of the present invention. Output buffer circuit 73 includes a NAND gate 75, a NOR gate 76, wide and long transistors 77, transistors 78A and 78B and pullup and pulldown transistors 80A and 80B. NAND gate 75 includes transistors 75A–75D. Wide and long transistors herein have a gate which is substantially longer and wider than that of other transistors in the buffer circuit. Transistors 75A, 75B, and 75D are connected to each other in series. The gates of transistors 75A and 75B and the gates of transistors 75C and 75D are connected to each other. Wide and long transistors 77 include transistor 77A and 77B. NOR gate 76 includes transistors 76A–76D. Transistors 76A and 76B are connected to each other in series. The gates of transistors 76A and 76D and the gates of transistors 76B and 76C are connected to each other. Input TRIB is applied to NAND gate 75 at gates 75A and 75B. Input DATA is applied to NAND gate 75 at transistors 75C and 75D, and to NOR gate 76 at transistors 76A and 76D. Analog voltage one is applied to wide and long transistor 77A, and analog voltage two is applied to wide and long transistor 77B. Input TRI is applied to NOR gate 66 at the gates of transistors 76A and 76B. According to the present invention, analog input voltages including ANALOG VOLTAGE ONE and ANALOG VOLTAGE TWO are used to control the degree that the large, long transistors 77 (i.e., M1 and M2) turn on. To obtain overcompensation according to the present invention without having a voltage near a threshold of the small and narrow transistors M1 and M2, transistors M3 and M4 (respectively transistors 78A and 78B) are added to ensure that when the reference voltages get too far from VDD and ground, respectively, transistors 78A and 78B start to turn on, adding current that transistors M1 and M2 must sink and source. The gates of respective transistors M3 and M4 are connected to the respective gates of transistors M1 and M2 for control by analog voltage one and analog voltage two respectively. This reduces the edge rate, and in some cases the turn on level, to output pullup and output pulldown transistors 80A and 80B so that a desired overcompensation is achieved and the edge rate and drive strength at pad 81 is substantially constant. Buffer circuit 73 as shown dissipates substantial dc power. According to an embodiment of the present invention, transistors M3 and M4 can be turned off after they have provided needed current. Accordingly, inverters I1 and I2 and transistors B19, B20, N15, and N16 can be added as a final turnoff circuit. The analog circuit, according to the present invention, responds to changes in process, voltage and temperature, ensuring that the buffer circuit operates effectively. Example edge rates and delays for an output buffer circuit according to the present invention as shown in FIG. 1, from the simulation of circuit values indicated, are shown in Tables I, II, and III below. The reference generator (REFGEN) resistor specified in respective ones of these tables represents the values of resistors R13 and R14 (respectively resistors 25'a and 25a) in FIG. 2. These resistors are rated at 300 ohm each according to this embodiment. Resistance variation simulations have been done to cover a variation in resistance values from a nominal value from −15% to +15% from processing. In particular, the variation from process of resistance values can be 255 ohm to 345 ohm. In each case, an output load of 30 PF (picofarad) is applied to pad 10C in FIG. 1. As shown in Tables I–III, for a substantial temperature range (e.g., 1 degree centigrade through 85 degree centigrade) and for a range of n-transistor (NTRAN) and p-transistor (PTRAN) processes, the edge rates are comparable for combinations of fast and slow processes as compared with typical processes. For example, for typical processes, edge rate variation ranges from 1.69–2.14 on the rise. For fast n-transistors and fast p-transistors, the comparable edge rate range extends from 2.27–2.63, i.e., less than a factor of two.

TABLE I

CONSTANT EDGE RATE OUTPUT BUFFER PERFORMANCE
(OUTPUT LOAD = 30 PF; REFGEN RESISTOR = 300 OHM)

| CONDITIONS | | | RISE | | FALL | |
|---|---|---|---|---|---|---|
| | | | Edge- | | Edge- | |
| Process (NTRAN/ PTRAN) | Voltage (volts) | Temp (deg C.) | rate 10%- 90% | Delay 50%- 50% | rate 90%- 10% | Delay 50%- 50% |
| T/T | 3.3 | 25 | 1.85 | 1.60 | 1.88 | 1.85 |
| | 3.0 | | 1.91 | 1.61 | 1.88 | 1.88 |
| | 3.6 | | 1.81 | 1.59 | 1.92 | 1.86 |
| | 3.3 | 85 | 2.14 | 1.83 | 2.37 | 2.29 |
| | 3.0 | | 2.14 | 1.79 | 2.27 | 2.22 |
| | 3.6 | | 2.10 | 1.85 | 2.51 | 2.36 |
| | 3.3 | 1 | 1.73 | 1.50 | 1.70 | 1.68 |
| | 3.0 | | 1.81 | 1.52 | 1.72 | 1.75 |
| | 3.6 | | 1.69 | 1.48 | 1.75 | 1.72 |
| F/S | 3.3 | 25 | 1.76 | 1.44 | 2.16 | 2.18 |
| | 3.0 | 85 | 2.33 | 2.05 | 2.01 | 1.95 |
| | 3.6 | 1 | 1.85 | 1.74 | 1.57 | 1.51 |
| S/F | 3.3 | 25 | 2.03 | 1.85 | 1.71 | 1.66 |
| | 3.0 | 85 | 2.04 | 1.65 | 2.67 | 2.70 |
| | 3.6 | 1 | 1.59 | 1.34 | 2.01 | 1.98 |
| S/S | 3.3 | 25 | 2.07 | 1.64 | 1.92 | 2.02 |
| | 3.0 | 85 | 2.57 | 2.09 | 2.44 | 2.56 |
| | 3.6 | 1 | 1.88 | 1.48 | 1.82 | 1.88 |
| F/F | 3.3 | 25 | 2.19 | 2.33 | 1.91 | 1.74 |
| | 3.0 | 85 | 2.60 | 2.63 | 2.43 | 2.17 |
| | 3.6 | 1 | 2.13 | 2.27 | 1.82 | 1.66 |

TABLE II

CONSTANT EDGE RATE OUTPUT BUFFER PERFORMANCE
(OUTPUT LOAD = 30 PF; REFGEN RESISTOR = 345 OHM)

| CONDITIONS | | | RISE | | FALL | |
|---|---|---|---|---|---|---|
| | | | Edge- | | Edge- | |
| Process (NTRAN/ PTRAN) | Voltage (volts) | Temp (deg C.) | rate 10%- 90% | Delay 50%- 50% | rate 90%- 10% | Delay 50%- 50% |
| T/T | 3.3 | 25 | 1.95 | 1.73 | 1.97 | 1.91 |
| | 3.0 | | 2.03 | 1.73 | 1.94 | 1.95 |
| | 3.6 | | 1.89 | 1.75 | 2.03 | 1.95 |
| | 3.3 | 85 | 2.24 | 2.01 | 2.56 | 2.45 |
| | 3.0 | | 2.30 | 2.00 | 2.46 | 2.39 |
| | 3.6 | | 2.21 | 2.06 | 2.70 | 2.52 |
| | 3.3 | 1 | 1.79 | 1.60 | 1.77 | 1.80 |
| | 3.0 | | 1.86 | 1.63 | 1.77 | 1.74 |
| | 3.6 | | 1.76 | 1.61 | 1.83 | 1.78 |
| F/S | 3.3 | 25 | 1.83 | 1.54 | 2.31 | 2.36 |
| | 3.0 | 85 | 2.53 | 2.39 | 2.1 | 2.10 |
| | 3.6 | 1 | 1.98 | 2.01 | 1.60 | 1.55 |

TABLE II-continued

CONSTANT EDGE RATE OUTPUT BUFFER PERFORMANCE
(OUTPUT LOAD = 30 PF; REFGEN RESISTOR = 345 OHM)

| CONDITIONS | | | RISE | | FALL | |
| --- | --- | --- | --- | --- | --- | --- |
| | | | Edge- | | Edge- | |
| Process (NTRAN/ PTRAN) | Voltage (volts) | Temp (deg C.) | rate 10%-90% | Delay 50%-50% | rate 90%-10% | Delay 50%-50% |
| S/F | 3.3 | 25 | 2.03 | 1.85 | 1.71 | 1.66 |
|  | 3.0 | 85 | 2.04 | 1.65 | 2.67 | 2.70 |
|  | 3.6 | 1 | 1.59 | 1.34 | 2.01 | 1.98 |
| S/S | 3.3 | 25 | 2.17 | 2.11 | 1.75 | 1.70 |
|  | 3.0 | 85 | 2.14 | 1.83 | 2.95 | 2.98 |
|  | 3.6 | 1 | 1.66 | 1.42 | 2.13 | 2.11 |
| F/F | 3.3 | 25 | 2.80 | 3.06 | 2.05 | 1.87 |
|  | 3.0 | 5 | 3.16 | 3.39 | 2.65 | 2.33 |
|  | 3.6 | 1 | 2.82 | 3.13 | 1.97 | 1.79 |

TABLE III

CONSTANT EDGE RATE OUTPUT BUFFER PERFORMANCE
(OUTPUT LOAD = 30 PF; REFGEN RESISTOR = 255 OHM)

| CONDITIONS | | | RISE | | FALL | |
| --- | --- | --- | --- | --- | --- | --- |
| | | | Edge- | | Edge- | |
| Process (NTRAN/ PTRAN) | Voltage (volts) | Temp (deg C.) | rate 10%-90% | Delay 50%-50% | rate 90%-10% | Delay 50%-50% |
| T/T | 3.3 | 25 | 1.75 | 1.42 | 1.72 | 1.71 |
|  | 3.0 |  | 1.83 | 1.44 | 1.67 | 1.68 |
|  | 3.6 |  | 1.73 | 1.43 | 1.79 | 1.73 |
|  | 3.3 | 85 | 1.98 | 1.57 | 2.00 | 1.91 |
|  | 3.0 |  | 2.10 | 1.65 | 1.97 | 1.91 |
|  | 3.6 |  | 1.98 | 1.64 | 2.22 | 2.11 |
|  | 3.3 | 1 | 1.65 | 1.22 | 1.96 | 1.97 |
|  | 3.0 |  | 1.74 | 1.36 | 1.55 | 1.58 |
|  | 3.6 |  | 1.62 | 1.37 | 1.64 | 1.60 |
| F/S | 3.3 | 25 | 1.65 | 1.32 | 1.96 | 1.97 |
|  | 3.0 | 85 | 2.15 | 1.71 | 1.87 | 1.84 |
|  | 3.6 | 1 | 1.76 | 1.53 | 1.49 | 1.45 |
| S/F | 3.3 | 25 | 1.89 | 1.61 | 1.56 | 1.54 |
|  | 3.0 | 85 | 2.02 | 1.60 | 2.12 | 2.07 |
|  | 3.6 | 1 | 1.54 | 1.26 | 1.84 | 1.82 |
| S/S | 3.3 | 25 | 2.02 | 1.62 | 1.91 | 1.99 |
|  | 3.0 | 85 | 2.57 | 2.08 | 2.45 | 2.56 |
|  | 3.6 | 1 | 1.81 | 1.41 | 1.68 | 1.73 |
| F/F | 3.3 | 25 | 1.89 | 1.85 | 1.76 | 1.62 |
|  | 3.0 | 85 | 2.19 | 2.09 | 2.23 | 2.00 |
|  | 3.6 | 1 | 1.78 | 1.74 | 1.69 | 1.54 |

What is claimed is:

1. A buffer circuit connected to an output pad, and comprising:
   a NAND gate and a pullup transistor having a transistor gate, connected together;
   a NOR gate and a pulldown transistor having a transistor gate, connected together, with the pulldown and pullup transistors being connected at a common output node;
   first and second wide and long transistors connected in series with the NAND gate and with the NOR gate, respectively;
   a source current transistor connected between a VDD potential source and the pullup transistor gate to provide enhanced source current to the pullup transistor;
   a sinking current transistor connected between a ground potential source and the pulldown transistor gate to provide enhanced sinking current to the pulldown transistor; and
   analog circuitry for controlling a rate at which at least one of the first and second wide and long transistors turns on.

2. The buffer circuit according to claim 1, wherein said NAND gate and said first wide and long transistor are connected in series between said VDD source and said ground source.

3. The buffer circuit according to claim 1, wherein said second wide and long transistor and said NOR gate are connected in series between said VDD source and said ground source.

4. A buffer circuit connected to an output pad, and comprising:
   a NAND gate and a pullup transistor having a transistor gate, connected together;
   a NOR gate and a pulldown transistor having a transistor gate, connected together, with the pulldown and pullup transistors being connected at a common output node;
   first and second long and wide transistors connected in series with the NAND gate and with the NOR gate, respectively;
   a source current transistor connected between a VDD potential source and the pullup transistor gate to provide enhanced source current to the pullup transistor;
   a sinking current transistor connected between a ground potential source and the pulldown transistor gate to provide enhanced sinking current to the pulldown transistor; and
   first and second connection circuits connecting the source current transistor and the sinking current transistor, respectively, to the first and second wide and long transistors, respectively, to permit controlled application of a first selected voltage to the source current transistor and to the first wide and long transistor, and controlled application of a second selected voltage to the sinking current transistor and to the second wide and long transistor.

5. A buffer circuit connected to an output pad, and comprising:
   a NAND gate and a pullup transistor having a transistor gate, connected together;
   a NOR gate and a pulldown transistor having a transistor gate, connected together, with the pulldown and pullup transistors being connected at a common output node;
   first and second long and wide transistors connected in series with the NAND gate and with the NOR gate, respectively;
   a source current transistor, connected between a source of VDD potential and the pullup transistor gate, to provide enhanced source current to the pullup transistor;
   a sinking current transistor, connected between a ground potential source and the pulldown transistor gate, to provide enhanced sinking current to the pulldown transistor; and
   third and fourth connection circuits controllable connecting the source current transistor and the sinking current transistor, respectively, to the VDD and ground potential sources, respectively.

6. The buffer circuit according to claim 5, wherein said common output node is connected to said third connection circuit.

7. The buffer circuit according to claim 5, wherein said common output node is connected to said fourth circuit.

8. A tristatable buffer circuit connected to an output pad and comprising:

a NAND gate responsive to a tristate input signal;

a NOR gate responsive to the complement of the tristate input signal;

a pullup transistor having a pullup transistor gate connected to said NAND gate;

a pulldown transistor having a pulldown transistor gate connected to said OR gate, said pulldown and pullup transistors being connected at a common output node;

first and second long and wide transistors respectively connected in series with said NAND and NOR gates;

a source current transistor connected between VDD and the gate of the pullup transistor to provide enhanced source current to the pullup transistor;

a sinking source transistor connected between ground and the gate of the pulldown transistor to provide enhanced sinking current to the pulldown transistor;

first and second wide and long transistors respectively connected to said NAND gate and said NOR gate, said NAND gate and said first wide and long transistor being connected in series between VDD and ground, and said second wide and long transistor and said NOR gate being connected in series between VDD and ground;

first and second connection circuits respectively connecting said source current transistor and said sinking current transistor to respective ones of said first and second wide and long transistors, to permit controlled application of a first selected voltage to both said source current transistor and said first wide and long transistor, and controlled application of a second selected voltage t both said sinking current transistor and said second wide and long transistor; and an output node connecting said pullup and pulldown transistors, and third and fourth connection circuits respectively controllably connecting said source current transistor and said sinking current transistor to respective VDD and ground potentials.

9. The buffer circuit according to claim 8, wherein said first wide and long transistor comprises a p-type transistor.

10. The buffer circuit according to claim 8, wherein said second wide and long transistor comprises an n-type transistor.

11. A method of stabilizing the output signal edges of a buffer circuit, the method comprising:

providing a NAND gate and a pullup transistor having a transistor gate, connected together at a common node;

providing a NOR gate and a pulldown transistor having a transistor gate, connected together at the common node;

providing a source current transistor, connected between the pullup transistor gate and a VDD potential source, and providing a sinking current transistor, connected between the pulldown transistor gate and a ground potential source, to provide enhanced source current and sinking current, respectively;

providing first and second wide and long transistors, connected in series with the NAND gate and with the NOR gate, respectively; and providing analog circuitry to control a rate at which at least one of the first and second wide and long transistors turns on.

12. The method of claim 11, further comprising selectively controlling initiation of current flow through at least one of said NAND gate and said NOR gate between said VDD potential source and said ground potential source; and providing enhanced availability to switch at least one of said pullup and pulldown transistors in response to the current flow through at least one of the NAND and the NOR gate.

* * * * *

UNITED STATES PATENT AND TRADEMARK OFFICE
CERTIFICATE OF CORRECTION

PATENT NO.    : 6,348,814 B1
DATED         : February 19, 2002
INVENTOR(S)   : LaVerne Peterson

It is certified that error appears in the above-identified patent and that said Letters Patent is hereby corrected as shown below:

<u>Title page,</u>
Item [73], please delete the Assignee name: "Cadenca Design Systems, Inc. (San Jose, CA )" and replace with -- Cadence Design Systems, Inc. (San Jose, CA) --

Signed and Sealed this

Fifteenth Day of October, 2002

Attest:

Attesting Officer

JAMES E. ROGAN
*Director of the United States Patent and Trademark Office*